(12) United States Patent
White, II

(10) Patent No.: US 10,461,582 B2
(45) Date of Patent: Oct. 29, 2019

(54) SYSTEMS, APPARATUS, AND METHODS FOR WIRELESS POWER RECEIVER COIL CONFIGURATION

(71) Applicant: QUALCOMM Incorporated, San Diego, CA (US)

(72) Inventor: Mark David White, II, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 664 days.

(21) Appl. No.: 14/567,776

(22) Filed: Dec. 11, 2014

(65) Prior Publication Data

US 2015/0280448 A1    Oct. 1, 2015

Related U.S. Application Data

(60) Provisional application No. 61/973,057, filed on Mar. 31, 2014.

(51) Int. Cl.
| | |
|---|---|
| *H02J 50/70* | (2016.01) |
| *H02J 50/12* | (2016.01) |
| *H02J 5/00* | (2016.01) |
| *H02J 7/02* | (2016.01) |
| *H02J 50/80* | (2016.01) |
| *H02J 50/90* | (2016.01) |

(Continued)

(52) U.S. Cl.
CPC .............. *H02J 50/12* (2016.02); *H01F 38/14* (2013.01); *H01F 38/18* (2013.01); *H02J 5/005* (2013.01); *H02J 7/025* (2013.01); *H02J 17/00* (2013.01); *H02J 50/10* (2016.02); *H02J 50/40* (2016.02); *H02J 50/60* (2016.02); *H02J 50/70* (2016.02); *H02J 50/80* (2016.02); *H02J 50/90* (2016.02); *H03H 7/40* (2013.01); *H01F 27/2804* (2013.01)

(58) Field of Classification Search
USPC .......................................................... 307/104
See application file for complete search history.

(56) References Cited

U.S. PATENT DOCUMENTS

| | | | |
|---|---|---|---|
| 4,751,513 A | * | 6/1988 | Daryoush .............. H01Q 1/247 343/700 MS |
| 5,061,941 A | | 10/1991 | Lizzi et al. |

(Continued)

FOREIGN PATENT DOCUMENTS

| | | |
|---|---|---|
| CN | 103023159 A | 4/2013 |
| CN | 103098330 A | 5/2013 |

(Continued)

OTHER PUBLICATIONS

International Search Report and Written Opinion—PCT/US2015/022814—ISA/EPO—dated Jun. 19, 2015.

*Primary Examiner* — Adi Amrany
(74) *Attorney, Agent, or Firm* — Polsinelli LLP

(57) ABSTRACT

Systems, methods and apparatus are disclosed for wirelessly receiving power. In one aspect, a coil is configured generate a voltage in response to magnetic field generated by a transmitter. The coil comprises a conductive material wound into at least three non-overlapping loop portions. The coil further includes a first loop portion, a second loop portion, and a third loop portion. The second and third loop portions at least partially enclosed by the first loop portion, the second and third loop portions non-circumscribing each other.

29 Claims, 7 Drawing Sheets

(51) Int. Cl.
*H02J 50/40* (2016.01)
*H02J 50/60* (2016.01)
*H02J 50/10* (2016.01)
*H01F 38/14* (2006.01)
*H01F 38/18* (2006.01)
*H02J 17/00* (2006.01)
*H03H 7/40* (2006.01)
*H01F 27/28* (2006.01)

(56) References Cited

U.S. PATENT DOCUMENTS

| | | | | |
|---|---|---|---|---|
| 5,621,422 A * | 4/1997 | Wang | ............ | H01Q 1/36 |
| | | | | 343/700 MS |
| 7,193,578 B1 * | 3/2007 | Harris | ............ | H01Q 1/38 |
| | | | | 343/767 |
| 7,215,284 B2 * | 5/2007 | Collinson | ............ | H01Q 5/00 |
| | | | | 343/700 MS |
| 7,714,791 B2 * | 5/2010 | Lavedas | ............ | H01Q 1/2216 |
| | | | | 343/742 |
| 8,788,191 B1 * | 7/2014 | Stuntebeck | ............ | H04W 52/0219 |
| | | | | 340/539.26 |
| 9,472,336 B2 * | 10/2016 | Jung | ............ | H01F 27/2871 |
| 9,608,327 B1 * | 3/2017 | Tai | ............ | H01Q 7/06 |
| 2001/0000960 A1 * | 5/2001 | Dettloff | ............ | G06K 7/0008 |
| | | | | 343/748 |
| 2007/0279002 A1 | 12/2007 | Partovi et al. | | |
| 2009/0096414 A1 * | 4/2009 | Cheng | ............ | H02J 5/005 |
| | | | | 320/108 |
| 2009/0224608 A1 * | 9/2009 | Cook | ............ | H01Q 7/08 |
| | | | | 307/104 |
| 2011/0050164 A1 * | 3/2011 | Partovi | ............ | H01F 5/003 |
| | | | | 320/108 |
| 2011/0050382 A1 * | 3/2011 | Baarman | ............ | H01F 1/26 |
| | | | | 336/221 |
| 2011/0095617 A1 * | 4/2011 | Cook | ............ | H01Q 7/08 |
| | | | | 307/104 |
| 2012/0049986 A1 * | 3/2012 | Cho | ............ | H01P 7/005 |
| | | | | 333/243 |
| 2012/0098486 A1 * | 4/2012 | Jung | ............ | H02J 7/025 |
| | | | | 320/108 |
| 2012/0146576 A1 * | 6/2012 | Partovi | ............ | H01F 7/0252 |
| | | | | 320/108 |
| 2012/0175967 A1 * | 7/2012 | Dibben | ............ | H02J 5/005 |
| | | | | 307/104 |
| 2012/0306714 A1 * | 12/2012 | Yosui | ............ | H01Q 1/2208 |
| | | | | 343/788 |
| 2012/0313577 A1 * | 12/2012 | Moes | ............ | H04B 5/0037 |
| | | | | 320/108 |
| 2013/0015719 A1 * | 1/2013 | Jung | ............ | H04B 5/0037 |
| | | | | 307/104 |
| 2013/0069586 A1 * | 3/2013 | Jung | ............ | H04B 5/0037 |
| | | | | 320/108 |
| 2013/0119779 A1 * | 5/2013 | Jung | ............ | H01F 27/2871 |
| | | | | 307/104 |
| 2013/0127411 A1 * | 5/2013 | Ichikawa | ............ | H01F 38/14 |
| | | | | 320/108 |
| 2013/0154383 A1 * | 6/2013 | Kasturi | ............ | H04B 5/0087 |
| | | | | 307/104 |
| 2013/0234509 A1 * | 9/2013 | Ichikawa | ............ | B60L 11/182 |
| | | | | 307/9.1 |
| 2013/0335018 A1 * | 12/2013 | Ichikawa | ............ | H04B 5/0081 |
| | | | | 320/108 |
| 2014/0070764 A1 * | 3/2014 | Keeling | ............ | H02J 50/50 |
| | | | | 320/108 |
| 2014/0091640 A1 | 4/2014 | Scholz et al. | | |
| 2014/0191584 A1 * | 7/2014 | Kato | ............ | H02J 7/0044 |
| | | | | 307/104 |
| 2014/0197694 A1 * | 7/2014 | Asanuma | ............ | H01F 38/14 |
| | | | | 307/104 |
| 2014/0225454 A1 * | 8/2014 | Ichikawa | ............ | B60L 11/182 |
| | | | | 307/104 |
| 2014/0333151 A1 | 11/2014 | Matsui et al. | | |

FOREIGN PATENT DOCUMENTS

| | | | | |
|---|---|---|---|---|
| CN | 103222019 A | | 7/2013 | |
| CN | 103636098 A | | 3/2014 | |
| CN | 103890875 A | | 6/2014 | |
| JP | 2010073976 A | * | 4/2010 | ............ B60L 50/51 |
| JP | 2012109449 A | | 6/2012 | |
| WO | WO-2012150293 A1 | | 11/2012 | |
| WO | WO-2013054399 A1 | | 4/2013 | |
| WO | WO-2013114576 A1 | | 8/2013 | |

\* cited by examiner

SYSTEMS, APPARATUS, AND METHODS FOR WIRELESS POWER RECEIVER COIL CONFIGURATION

CROSS REFERENCE TO RELATED APPLICATIONS

This application claims priority under 35 U.S.C. § 119(e) to U.S. Provisional Patent Application No. 61/973,057 entitled "SYSTEMS, APPARATUS, AND METHODS FOR WIRELESS POWER RECEIVER COIL CONFIGURATION" filed on Mar. 31, 2014 the disclosure of which is hereby incorporated by reference in its entirety.

FIELD

The present disclosure relates generally to a configuration of a wireless power receiver.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the subject matter described in the disclosure provides an apparatus for wirelessly receiving power. The apparatus includes a coil configured generate a voltage in response to a magnetic field generated by a transmitter. The coil comprising a conductive material having at least three loop portions. The at least three loop portions including a first loop portion, a second loop portion, and a third loop portion. The second and third loop portions at least partially enclosed by the first loop portion. The second and third loop portions non-circumscribing and non-overlapping with each other.

Another aspect of the subject matter described in the disclosure provides an implementation of a method of wirelessly receiving power from a transmitter. The method includes receiving wireless power from a transmitter via a magnetic field. The method further includes generating a voltage in a coil in response to the magnetic field generated by a transmitter. The coil comprising a conductive material having at least three loop portions. The at least three loop portions including a first loop portion, a second loop portion, and a third loop portion. The second and third loop portions at least partially enclosed by the first loop portion. The second and third loop portions non-circumscribing and non-overlapping with each other.

Yet another aspect of the subject matter described in the disclosure provides an apparatus for wirelessly receiving power. The apparatus includes means for wirelessly receiving power via a magnetic field, the means for wirelessly receiving power including at least three loop portions, including a first loop portion, a second loop portion, and a third loop portion, the second and third loop portions at least partially enclosed by the first loop portion, the second and third loop portions non-circumscribing and non-overlapping with each other. The apparatus further includes means for providing the received power to a load.

Figure 1:
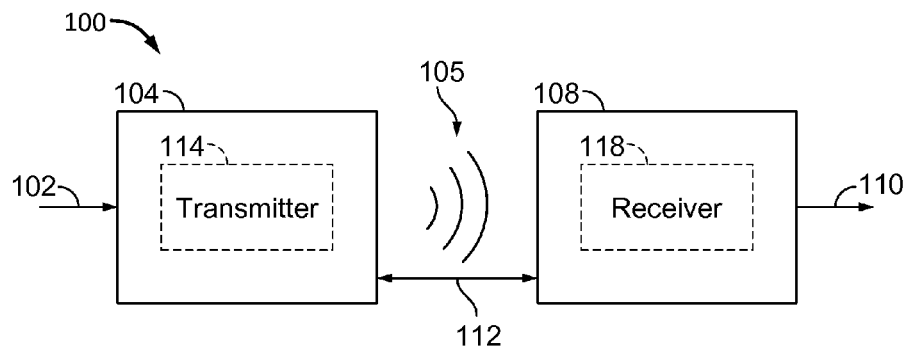
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" to achieve power transfer.

FIG. 1 is a functional block diagram of a wireless power transfer system 100, in accordance with one exemplary implementation. An input power 102 may be provided to a transmitter 104 from a power source (not shown) to generate a wireless (e.g., magnetic or electromagnetic) field 105 for performing energy transfer. A receiver 108 may couple to the wireless field 105 and generate an output power 110 for storing or consumption by a device (not shown) coupled to the output power 110. Both the transmitter 104 and the receiver 108 are separated by a distance 112.

In one exemplary implementation, the transmitter 104 and the receiver 108 are configured according to a mutual resonant relationship. When the resonant frequency of the receiver 108 and the resonant frequency of the transmitter 104 are substantially the same or very close, transmission losses between the transmitter 104 and the receiver 108 are minimal. As such, wireless power transfer may be provided over a larger distance in contrast to purely inductive solutions that may require large antenna coils which are very close (e.g., sometimes within millimeters). Resonant inductive coupling techniques may thus allow for improved efficiency and power transfer over various distances and with a variety of inductive coil configurations.

The receiver 108 may receive power when the receiver 108 is located in the wireless field 105 produced by the transmitter 104. The wireless field 105 corresponds to a region where energy output by the transmitter 104 may be captured by the receiver 108. The wireless field 105 may correspond to the "near field" of the transmitter 104 as will be further described below. The transmitter 104 may include a transmit antenna or coil 114 for transmitting energy to the receiver 108. The receiver 108 may include a receive antenna or coil 118 for receiving or capturing energy transmitted from the transmitter 104. The near-field may correspond to a region in which there are strong reactive fields resulting from the currents and charges in the transmit coil 114 that minimally radiate power away from the transmit coil 114. The near-field may correspond to a region that is within about one wavelength (or a fraction thereof) of the transmit coil 114.

As described above, efficient energy transfer may occur by coupling a large portion of the energy in the wireless field 105 to the receive coil 118 rather than propagating most of the energy in an electromagnetic wave to the far field. When positioned within the wireless field 105, a "coupling mode" may be developed between the transmit coil 114 and the receive coil 118. The area around the transmit antenna 114 and the receive antenna 118 where this coupling may occur is referred to herein as a coupling mode region.

Figure 2:
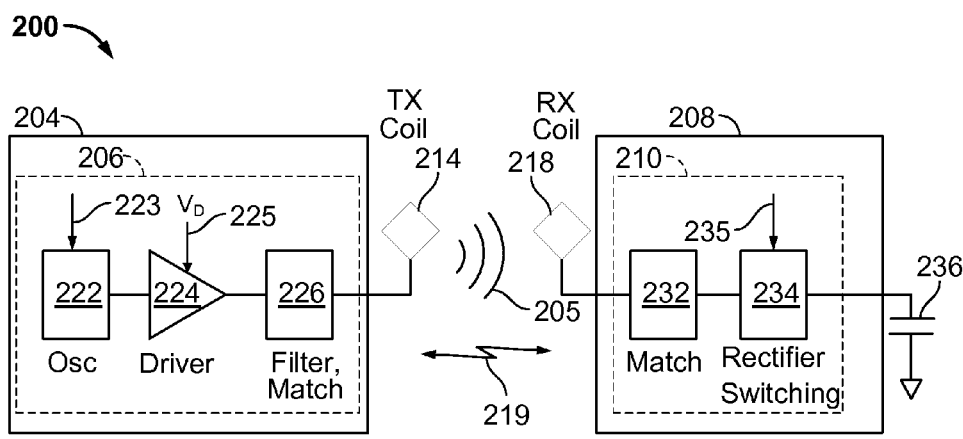
FIG. 2 is a functional block diagram of exemplary components that may be used in the wireless power transfer system of FIG. 1, in accordance with various exemplary embodiments of the invention.

FIG. 2 is a functional block diagram of a wireless power transfer system 200, in accordance with another exemplary implementation. The system 200 includes a transmitter 204 and a receiver 208. The transmitter 204 may include a transmit circuitry 206 that may include an oscillator 222, a driver circuit 224, and a filter and matching circuit 226. The oscillator 222 may be configured to generate a signal at a desired frequency that may be adjusted in response to a frequency control signal 223. The oscillator 222 may provide the oscillator signal to the driver circuit 224. The driver circuit 224 may be configured to drive the transmit antenna 214 at, for example, a resonant frequency of the transmit antenna 214 based on an input voltage signal (VD) 225. The driver circuit 224 may be a switching amplifier configured to receive a square wave from the oscillator 222 and output a sine wave. For example, the driver circuit 224 may be a class E amplifier.

The filter and matching circuit 226 may filter out harmonics or other unwanted frequencies and match the impedance of the transmitter 204 to the transmit antenna 214. As a result of driving the transmit antenna 214, the transmit antenna 214 may generate a wireless field 205 to wirelessly output power at a level sufficient for charging a battery 236 of an electric vehicle, for example.

The receiver 208 may include a receive circuitry 210 that may include a matching circuit 232 and a rectifier circuit 234. The matching circuit 232 may match the impedance of the receive circuitry 210 to the receive antenna 218. The rectifier circuit 234 may generate a direct current (DC) power output from an alternate current (AC) power input to charge the battery 236, as shown in FIG. 2. The receiver 208 and the transmitter 204 may additionally communicate on a separate communication channel 219 (e.g., Bluetooth, Zigbee, cellular, etc). The receiver 208 and the transmitter 204 may alternatively communicate via in-band signaling using characteristics of the wireless field 205.

As described more fully below, receiver 208, that may initially have a selectively disablable associated load (e.g., battery 236), may be configured to determine whether an amount of power transmitted by transmitter 204 and receiver by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
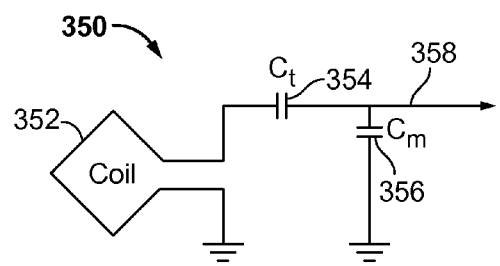
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of the transmit circuitry 206 or the receive circuitry 210 of FIG. 2 including a transmit or receive antenna, in accordance with exemplary implementations. As illustrated in FIG. 3, a transmit or receive circuitry 350 may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, the antenna 352 is an example of a "power transfer component" of a type that is configured to wirelessly output and/or receive power.

The antenna 352 may include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled mode region of the transmit antenna 214 may be more powerful.

As stated, efficient transfer of energy between the transmitter 104/204 and the receiver 108/208 may occur during matched or nearly matched resonance between the transmitter 104/204 and the receiver 108/208. However, even when resonance between the transmitter 104/204 and receiver 108/208 are not matched, energy may be transferred, although the efficiency may be affected. For example, the efficiency may be less when resonance is not matched. Transfer of energy occurs by coupling energy from the wireless field 105/205 of the transmit coil 114/214 to the receive coil 118/218, residing in the vicinity of the wireless field 105/205, rather than propagating the energy from the transmit coil 114/214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, a capacitor 354 and a capacitor 356 may be added to the transmit or receive circuitry 350 to create a resonant circuit that selects a signal 358 at a resonant frequency. Accordingly, for larger diameter antennas, the size of capacitance needed to sustain resonance may decrease as the diameter or inductance of the loop increases.

Furthermore, as the diameter of the antenna increases, the efficient energy transfer area of the near field may increase. Other resonant circuits formed using other components are also possible. As another non limiting example, a capacitor may be placed in parallel between the two terminals of the circuitry 350. For transmit antennas, the signal 358, with a frequency that substantially corresponds to the resonant frequency of the antenna 352, may be an input to the antenna 352.

Referring to FIGS. 1 and 2, the transmitter 104/204 may output a time varying magnetic (or electromagnetic) field with a frequency corresponding to the resonant frequency of the transmit coil 114/214. When the receiver 108/208 is within the wireless field 105/205, the time varying magnetic (or electromagnetic) field may induce a current in the receive coil 118/218. As described above, if the receive coil 118/218 is configured to resonate at the frequency of the transmit coil 114/214, energy may be efficiently transferred. The AC signal induced in the receive coil 118/218 may be rectified as described above to produce a DC signal that may be provided to charge or to power a load.

Figure 4:
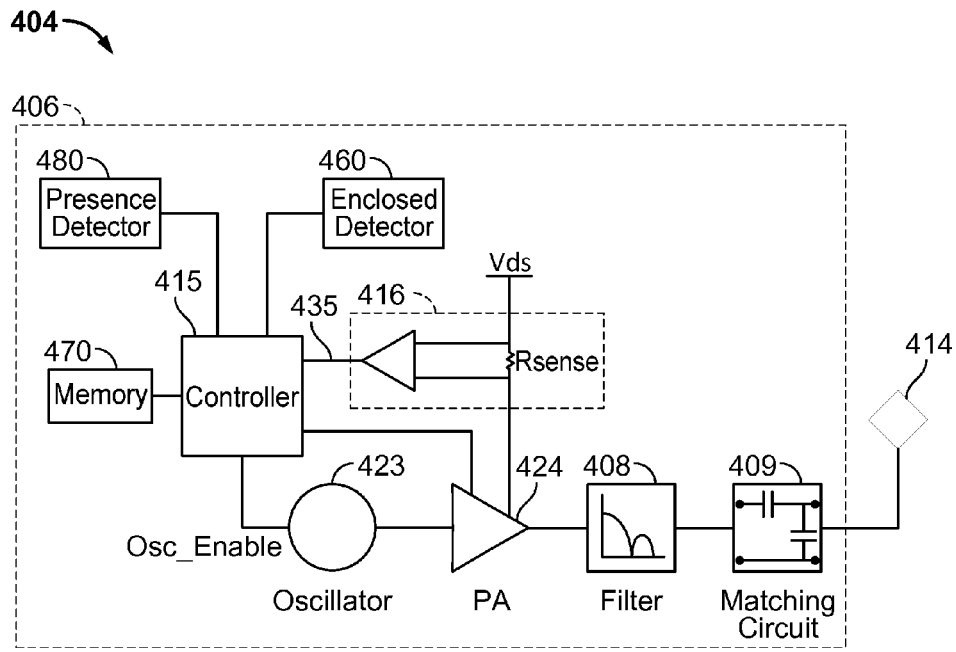
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit antenna 414. The transmit antenna 414 may be the antenna 352 as shown in FIG. 3. Transmit circuitry 406 may provide RF power to the transmit antenna 414 by providing an oscillating signal resulting in generation of energy (e.g., magnetic flux) about the transmit antenna 414. Transmitter 404 may operate at any suitable frequency. By way of example, transmitter 404 may operate at the 6.78 MHz ISM band.

Transmit circuitry 406 may include a fixed impedance matching circuit 409 for matching the impedance of the transmit circuitry 406 (e.g., 50 ohms) to the transmit antenna 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the antenna 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit antenna 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit antenna 414. By way of example, a load sensing circuit 416 monitors the current flowing to the driver circuit 424, that may be affected by the presence or absence of active receivers in the vicinity of the field generated by transmit antenna 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit antenna 414 may be implemented with a Litz wire or as an antenna strip with the thickness, width and metal type selected to keep resistive losses low. In a one implementation, the transmit antenna 414 may generally be configured for association with a larger structure such as a table, mat, lamp or other less portable configuration. Accordingly, the transmit antenna 414 generally may not need "turns" in order to be of a practical dimension. An exemplary implementation of a transmit antenna 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit antenna 414 may transmit at a specific frequency. In some cases, these regulations are meant to protect humans from electromagnetic radiation. However, there may be environments where a transmit antenna 414 is placed in areas not occupied by humans, or occupied infrequently by humans, such as, for example, garages, factory floors, shops, and the like. If these environments are free from humans, it may be permissible to increase the power output of the transmit antenna 414 above the normal power restrictions regulations. In other words, the controller 415 may adjust the power output of the transmit antenna 414 to a regulatory level or lower in response to human presence and adjust the power output of the transmit antenna 414 to a level above the regulatory level when a human is outside a regulatory distance from the electromagnetic field of the transmit antenna 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive antenna 218 that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
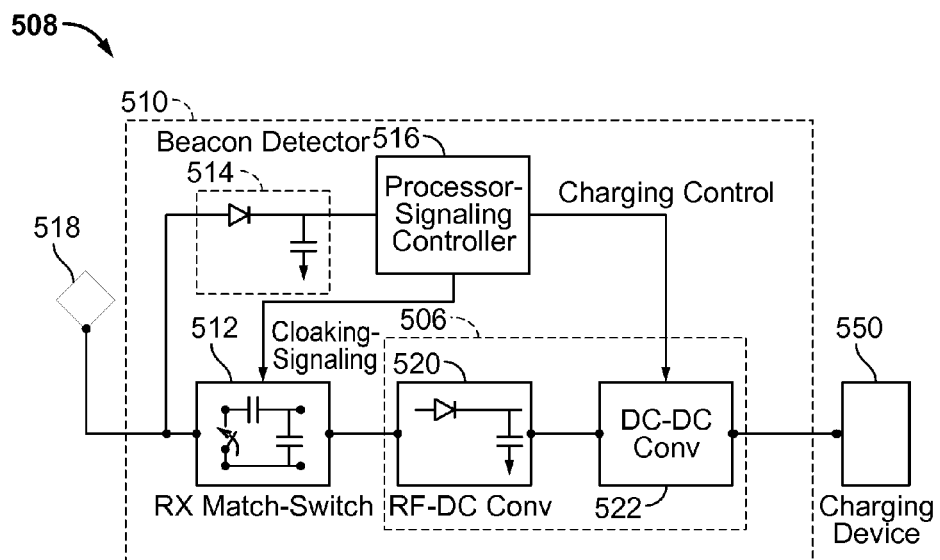
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive antenna 518. Receiver 508 further couples to device 550 for providing received power thereto. It should be noted that receiver 508 is illustrated as being external to device 550 but may be integrated into device 550. Energy may be propagated wirelessly to receive antenna 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (and other medical devices), and the like.

Receive antenna 518 may be tuned to resonate at the same frequency, or within a specified range of frequencies, as transmit antenna 414 (FIG. 4). Receive antenna 518 may be similarly dimensioned with transmit antenna 414 or may be differently sized based upon the dimensions of the associated device 550. By way of example, device 550 may be a portable electronic device having diametric or length dimension smaller that the diameter of length of transmit antenna 414. In such an example, receive antenna 518 may be implemented as a multi-turn coil in order to reduce the capacitance value of a tuning capacitor (not shown) and increase the receive coil's impedance. By way of example, receive antenna 518 may be placed around the substantial circumference of device 550 in order to maximize the antenna diameter and reduce the number of loop turns (i.e., windings) of the receive antenna 518 and the inter-winding capacitance.

Receive circuitry 510 may provide an impedance match to the receive antenna 518. Receive circuitry 510 includes power conversion circuitry 506 for converting a received RF energy source into charging power for use by the device 550. Power conversion circuitry 506 includes an RF-to-DC converter 520 and may also in include a DC-to-DC converter 522. RF-to-DC converter 520 rectifies the RF energy signal received at receive antenna 518 into a non-alternating power with an output voltage represented by $V_{rect}$. The DC-to-DC converter 522 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive antenna 518 to the power conversion circuitry 506 or alternatively for disconnecting the power conversion circuitry 506. Disconnecting receive antenna 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive antenna 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
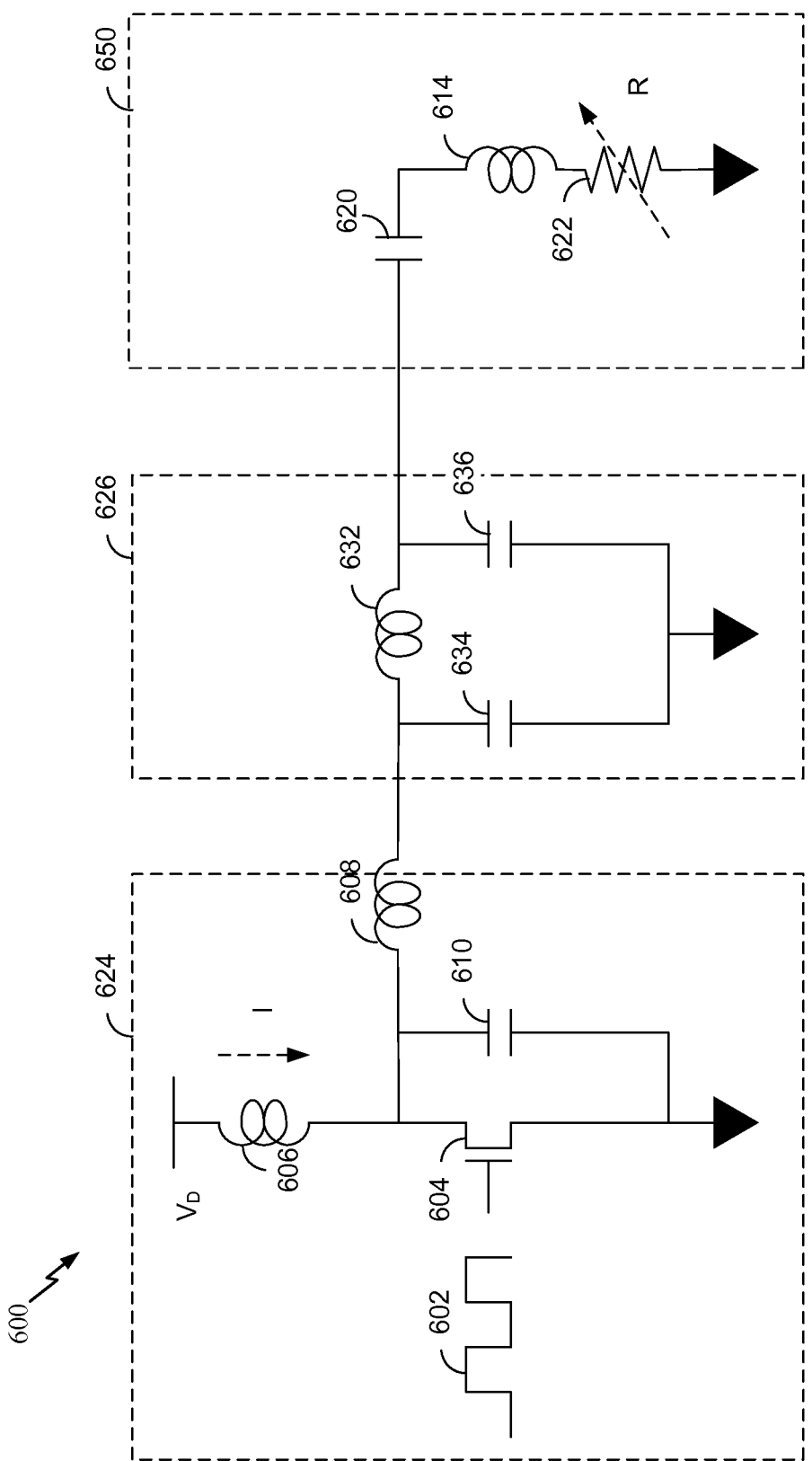
FIG. 6 is a schematic diagram of a portion of transmit circuitry that may be used in the transmit circuitry of FIG. 4, in accordance with exemplary embodiments.

FIG. 6 is a schematic diagram of a portion of transmit circuitry 600 that may be used in the transmit circuitry 406 of FIG. 4. The transmit circuitry 600 may include a driver circuit 624 as described above in FIG. 4. The driver circuit 624 may be similar to the driver circuit 424 shown in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier, however, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising an antenna 614. The transmit circuit 650 may include a series resonant circuit having a capacitance 620 and inductance (e.g., that may be due to the inductance or capacitance of the antenna or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

It may be desirable for a receive antenna 518 (FIG. 5)—also referred to as a receiver resonator or coil—of a particular design classification to be inter-operable with all existing transmitters which are designed to support that particular design classification of the receiver. For example, different transmitters may be designed with different coil configurations/topologies with varying degrees of magnetic field uniformity and other differing characteristics. Additionally, it is desirable that transmitters which were not designed to support that particular design classification of a receiver should have some functionality with the receiver. It is difficult to design a receiver coil structure which functions according to requirements across different transmitters. Stated another way it is difficult to develop a repeatable, robust approach a resonator design which has a high probability of being interoperable on different required transmitters.

In an aspect, it may be difficult for a transmitter antenna/coil 414 (FIG. 4) to be designed such that it creates a uniform magnetic field. Instead, there may be several spots on the transmitter 404 where the field is much greater or much lower than the nominal field strength. This in turn forces a receiver designer to either build the receiver circuitry to withstand high variances in applied voltages or to design a resonator (e.g., antenna/coil configuration in combination with circuitry to create a resonate circuit) which averages the peaks and valleys of a magnetic field of the transmitter 404.

Since circuit designs may be limited in their ability to accept a wide voltage range. In accordance, in an embodiment, a receiver antenna/coil structure is provided that includes multiple loops inside of a larger loop (e.g., two loops inside a larger loop as described below). In aspects with embodiments described herein, a receiver coil configuration is provided that is configured to average the field as much as possible and minimize the applied voltage variance. For example, in testing the ratio of the maximum voltage received over the minimum voltage received from a transmitter over various receiver antenna/coil structure configurations, an optimal configuration included two loops inside a larger loop, as described below. For one particular transmitter configuration an example of an exemplary measured ratio of the maximum voltage received over the minimum voltage received from a transmitter was 1.4. Other receiver configurations when used with the particular transmitter configuration had ratios of 1.5 and higher. In one aspect, this receiver coil structure in accordance with embodiments described herein may provide greater averaging of the magnetic field that a transmitter creates. Furthermore, in another aspect, this receiver coil structure may provide greater variability of design dimensions to allow higher resolution of design tweaking. The multiple loops inside of the larger loop may provide better averaging than a two turn antenna design (e.g., one loop inside of a larger loop) or a three loop antenna (e.g., a second loop inside of first loop and a third loop inside the second loop).

Figure 7:
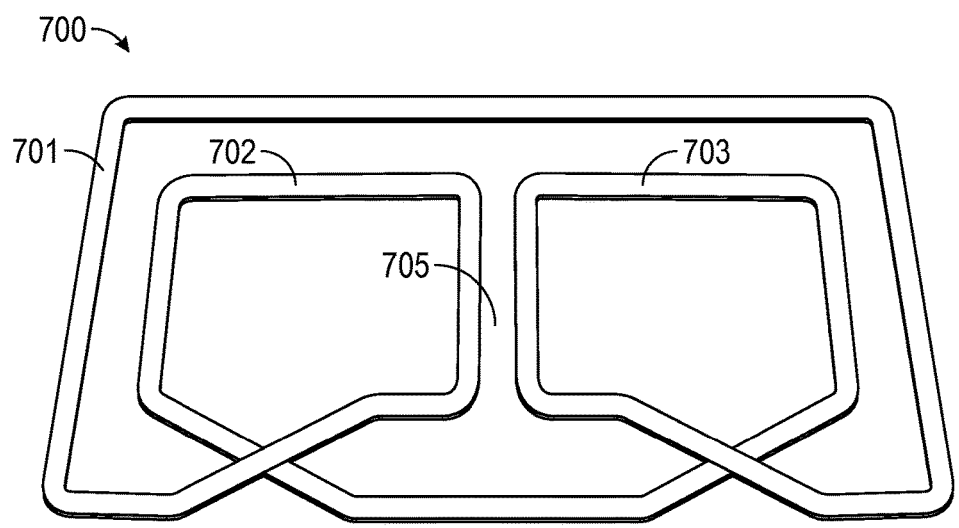
FIG. 7 is a diagram of a receiver antenna/coil structure in accordance with an embodiment.

FIG. 7 is a diagram of a receiver antenna/coil structure 700 in accordance with an embodiment. In some aspects, the receiver antennas or coils 118, 218, and 518 of FIGS. 1, 2, and 5 may be formed as the coil configuration of FIG. 7. As shown in FIG. 7, the receiver antenna/coil structure 700 comprises a coil comprising three loops 701, 702, and 703. Two of the loops 702 and 703 are positioned inside of a larger loop 701 that at least substantially surrounds the two inner loops 702 and 703. Each of the loops 702 and 703 are non-overlapping and non-circumscribing. As shown in FIG. 7, the loops 702 and 703 are rectangular in shape, similar in size, and adjacent to one another. In other aspects, other shapes (e.g., circles, squares, etc.) and configurations are also possible. In some embodiments, more than two loops may be positioned inside of the loop 701. In some embodiments, the loops may be configured together to create a single coil structure. In some embodiments, the receiver antenna/coil structure 700 may include more than one coil. The coil or coils used may include any conductive material (e.g., copper, silver, aluminum, etc.).

In some aspects, the receiver antenna/coil structure 700 may form a single coil structure where the loops are located substantially on a common plane. The receiver antenna/coil structure 700 may be non-planar in some aspects and planar with a flexible plane in other aspects. For example, the loop 701 may be located on a different plane than the loops 702 and 703. In other embodiments, the loop 702 may be located on a different plane than loop 703. In some aspects, the receiver antenna/coil structure 700 may be oriented in various orientations including vertical, horizontal, and diagonally, among other possibilities. Further, the receiver antenna/coil structure 700 may be located on or in a variety of items including surfaces, walls, tape, and portable electronics, among other possibilities. In certain aspects, the single coil structure as described with reference to FIG. 7 may further be used as a transmitter coil such as the transmitter coils 114, 214, and 414 of FIGS. 1, 2, and 4.

In certain aspects, in the portions of the receiver antenna/coil structure 700 where the loops 702 and 703 are closest to each other, the current running through the loop 702 may be in the opposite direction of the current running through the loop 703. For example, in the location 705, the current running through the loop 702 may be running from the top of the page to the bottom of the page and the current running through the loop 703 may be running from the bottom of the page to the top of the page. In other words, the current flowing through the loop 702 at location 705 may be running in an opposite direction as compared to the current flowing through the loop 703 at location 705. The opposing currents may create a field cancelling effect which may provide greater averaging of the magnetic field that a transmitter creates.

Figure 8A:
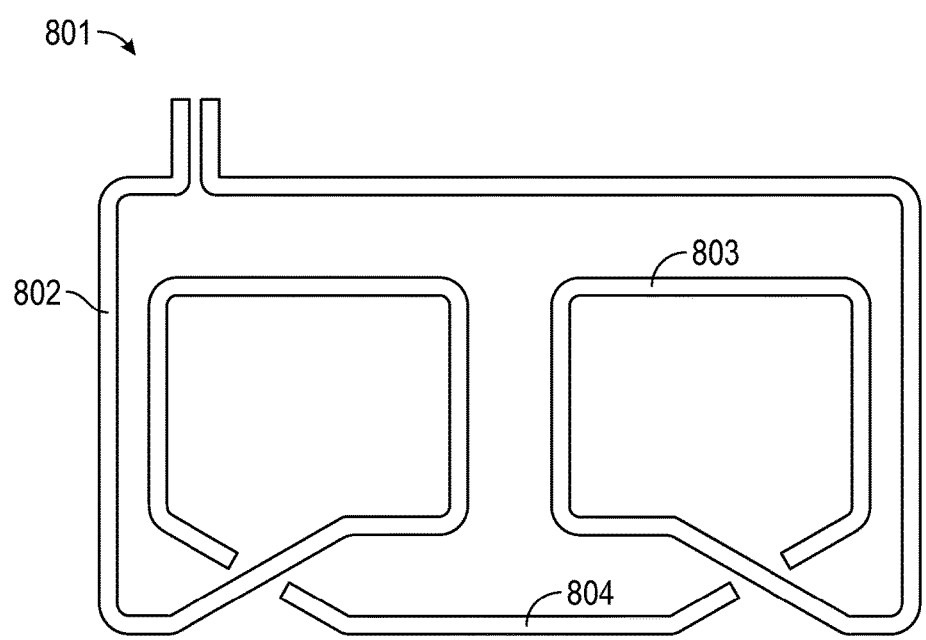
FIG. 8A is a diagram of a layer of a receiver antenna/coil structure in accordance with an embodiment.
Figure 8B:
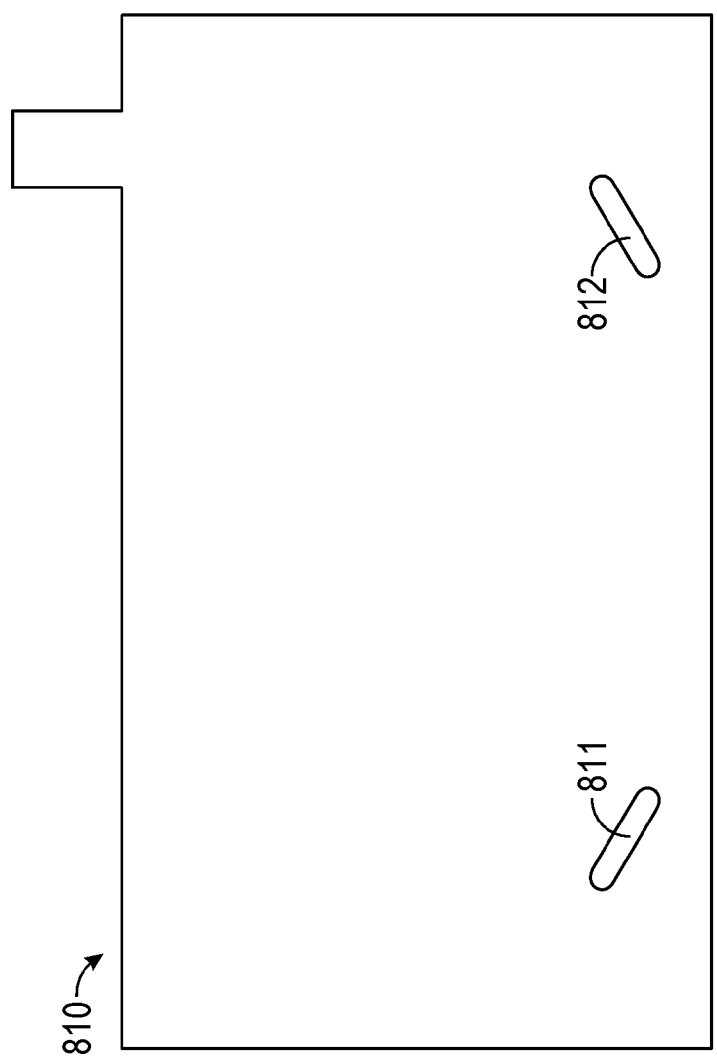
FIG. 8B is a diagram of a layer of a receiver antenna/coil structure in accordance with an embodiment.

FIG. 8A is a diagram of a resonator layer 801 of an exemplary receiver antenna/coil structure 800 in accordance with an embodiment. FIG. 8B is a diagram of a resonator layer 810 of the exemplary receiver antenna/coil structure 800 in accordance with an embodiment. In some embodiments, the layers 801 and 810 may be combined to create the receiver antenna/coil structure 800 which may be similar to the receiver antenna/coil structure 700. Layer 801 comprises a first portion 802, a second portion 803, and a third portion 804 of the receiver antenna/coil structure 800. In FIG. 8B, layer 810 comprises a fourth portion 811 and a fifth portion 812 of the receiver antenna/coil structure 800. When layer 801 is combined with layer 810, the fourth portion 811 provides a connection between the first portion 802 and the third portion 804. When layer 801 is combined with layer 810, the fifth portion 812 provides a connection between the second portion 803 and the third portion 804.

Figure 8C:
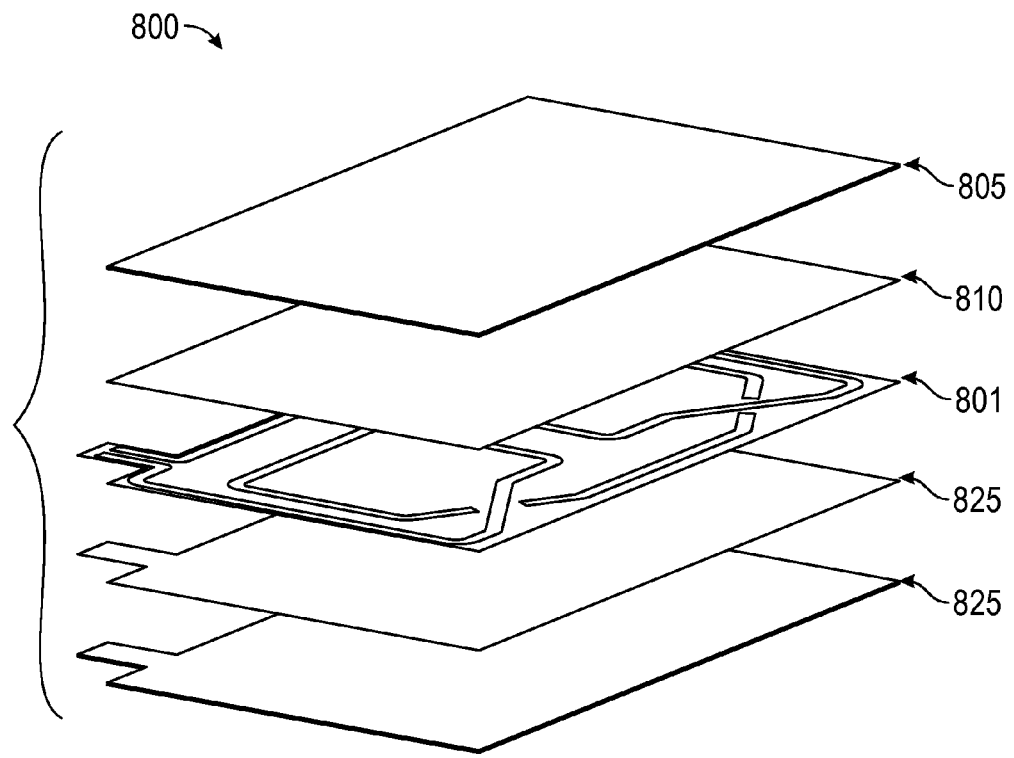
FIG. 8C is a diagram of a receiver antenna/coil structure in accordance with an embodiment.

FIG. 8C is an exploded view of an exemplary receiver antenna/coil structure 800 in accordance with an embodiment. The receiver antenna/coil structure 800 includes resonator layers 801, 805, 810, and 825. Layer 805 comprises a ferrite material with an adhesive back. In receiver antenna/coil structure 800 layer 805 is placed on top of the layer 810 of FIG. 8B. Layer 810 is then placed on top of the layer 801 of FIG. 8A such that layer 810 is located between layers 805 and 801. Layer 801 is then placed on top of a layer 825 such that layer 801 is located between layers 810 and layer 825. Layer 825 comprises an adhesive layer. In some aspects, layer 825 may also comprise of a pressure sensitive backed layer that includes a peel off liner. Layer 825 is then placed on top of layer 825. For example, one layer 825 may comprise the peel off liner and the other layer 825 may comprise the adhesive layer for securing both layers 825 together. Though the layers are configured in a particular order, other configurations are also possible. The layers 801, 805, 810, and 825 may be arranged in a different order or there may be additional layers added or some layers may be removed.

Figure 8D:
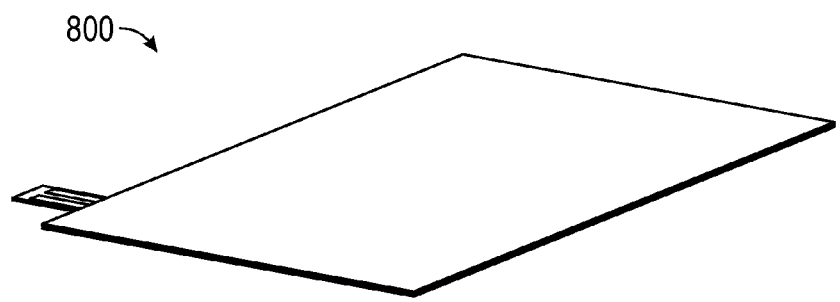
FIG. 8D is a diagram of a receiver antenna/coil structure in accordance with an embodiment.

FIG. 8D is a diagram of the exemplary receiver antenna/coil structure 800 in accordance with an embodiment. FIG. 8D shows the receiver antenna/coil structure 800 with the combined layers discussed in FIG. 8C.

Figure 9:
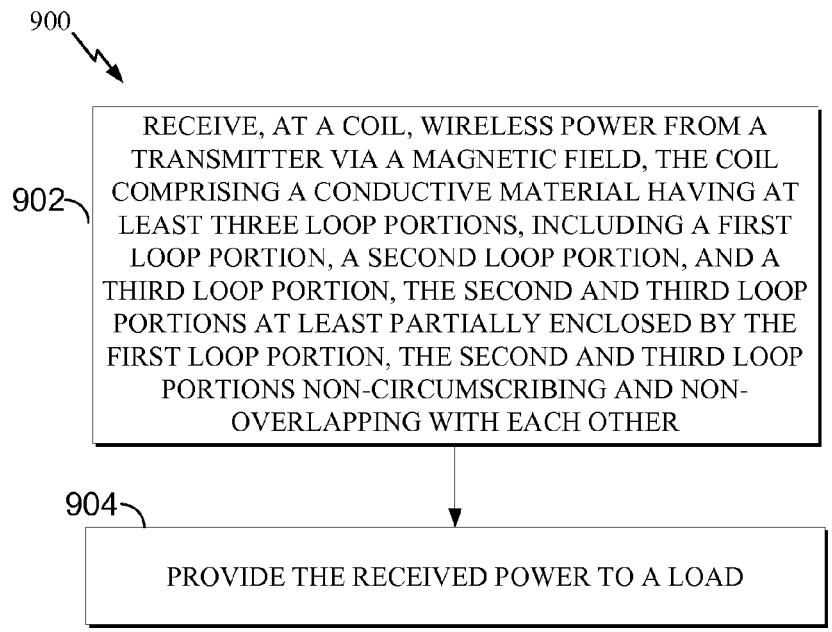
FIG. 9 is a flow chart of an exemplary method of receiving wireless power from a transmitter.

FIG. 9 is a flow chart of an exemplary method 900 of receiving wireless power from a transmitter. The steps or actions described in FIG. 9 may be implemented in, or carried out by, either of the circuits and/or devices shown in either of FIG. 1-3, or 5. Block 902 may include receiving, at a coil, wireless power from a transmitter via a magnetic field, the coil comprising a conductive material having at least three loop portions, including a first loop portion, a second loop portion, and a third loop portion, the second and third loop portions at least partially enclosed by the first loop portion, the second and third loop portions non-circumscribing and non-overlapping with each other. Block 904 may include providing the received power to a load.

Figure 10:
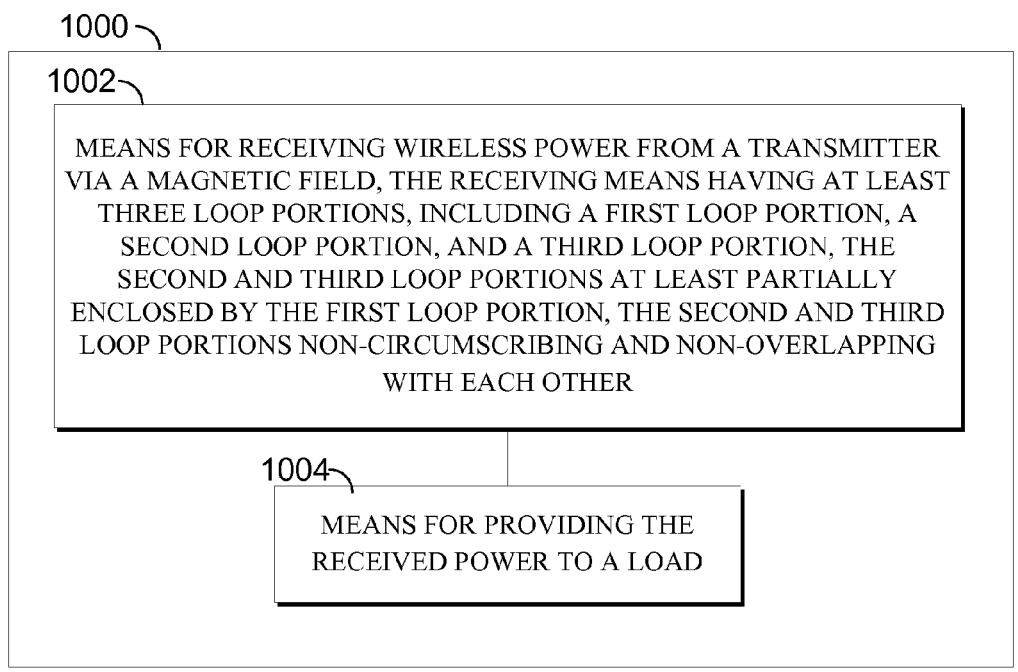
FIG. 10 is a functional block diagram of an apparatus for receiving wireless power from a transmitter.

FIG. 10 is a functional block diagram of a power cable apparatus 1000, in accordance with an exemplary embodiment of the invention. The apparatus comprises means 1002 and 1004 for the various actions discussed with respect to FIGS. 1-9.

The apparatus 1000 includes means 1002 for receiving wireless power from a transmitter via a magnetic field, the receiving means having at least three loop portions, including a first loop portion, a second loop portion, and a third loop portion, the second and third loop portions at least partially enclosed by the first loop portion, the second and third loop portions non-circumscribing and non-overlapping with each other. In an embodiment, the means 1002 can be configured to perform one or more of the functions described above with respect to block 902 (FIG. 9). In various embodiments, the means 1002 for receiving wireless power from a transmitter via a magnetic field can be implemented by the receiver antennas or coils 118, 218, and 518 of FIGS. 1, 2, and 5.

The apparatus 1000 further includes means 1004 for providing the received power to a load. In an embodiment, the means 1004 can be configured to perform one or more of the functions described above with respect to block 904 (FIG. 9). In various embodiments, the means 1004 can be implemented by the receive circuitry 210 and 510 of FIGS. 2 and 5.

Further examples of the invention are defined as follows:

1. An apparatus for wirelessly receiving power. The apparatus includes a coil configured generate a voltage in response to a magnetic field generated by a transmitter. The coil includes a conductive material having at least three loop portions, including a first loop portion, a second loop portion, and a third loop portion. The second and third loop portions are at least partially enclosed by the first loop portion. The second and third loop portions are non-circumscribing and non-overlapping with each other.

2. The apparatus of example 1, wherein at least one of the first loop portion, the second loop portion, or the third loop portion have a substantially rectangular dimension.

3. The apparatus of example 1, wherein a current in a portion of the second loop portion is in the opposite direction of a current in a portion of the third loop portion.

4. The apparatus of example 3, wherein the portion of the second loop portion having the current in the opposite direction of the current in the portion of the third loop portion comprises a portion positioned closest to the third loop portion.

5. The apparatus of any of examples 1, 3, or 4, wherein the second loop portion and the third loop portions have non-symmetrical dimensions.

6. The apparatus of any of the preceding examples, wherein the second loop portion and the third loop portions have substantially common dimensions and are placed adjacent to each other.

7. The apparatus of any of the preceding examples, wherein the second and third loop portions are substantially fully enclosed by the first loop portion.

8. The apparatus of any of the preceding examples, wherein the coil further comprises more than two loop portions at least partially enclosed by the first loop portion.

9. The apparatus of any of the preceding examples, wherein the coil comprises a single winding of the conductive material having at least three non-overlapping loop portions.

10. The apparatus of any of the preceding examples 1-8, wherein the coil comprises two or more coils.

11. The apparatus of any of the preceding examples, wherein the first loop portion, the second loop portion, and the third loop portion, are substantially co-planar.

12. The apparatus of any of the preceding examples 1-10, wherein the first loop portion, the second loop portion, and the third loop portion, are located on different planes.

13. The apparatus of any of the preceding examples 1-10, wherein the first loop portion is located on a first plane, wherein the second loop portion and the third loop portion are located on a second plane different from the first plane.

14. The apparatus of any of the preceding examples, further comprising a resonant circuit comprising the coil, the resonant circuit configured to resonate at an operating frequency of the magnetic field, the coil configured to inductively receive power via the magnetic field.

15. The apparatus of any of the preceding examples, further comprising a receive circuit coupled to the coil and configured to power or charge a load based at least in part on the generated voltage.

16. The apparatus of any of the preceding examples, wherein the coil is further configured to average the magnetic field such that a ratio of a maximum voltage received to a minimum voltage received by the coil satisfies a threshold.

17. The apparatus of example 17, wherein the ratio comprises a value less than 1.5.

18. A method of receiving wireless power. The method includes receiving, at a coil, wireless power from a transmitter via a magnetic field, the coil comprising a conductive material having at least three loop portions, including a first loop portion, a second loop portion, and a third loop portion, the second and third loop portions at least partially enclosed by the first loop portion, the second and third loop portions non-circumscribing and non-overlapping with each other. The method further includes providing the received power to a load.

19. The method of example 18, wherein a current in a portion of the second loop portion is in the opposite direction of a current in a portion of the third loop portion.

20. The method of example 19, wherein the portion of the second loop portion having the current in the opposite direction of the current in the portion of the third loop portion comprises a portion positioned closest to the third loop portion.

21. The method of any of the preceding examples 18-20, wherein the second loop portion and the third loop portions have substantially common dimensions and are placed adjacent to each other.

22. The method of any of the preceding examples 18-21, wherein the second and third loop portions are substantially fully enclosed by the first loop portion.

23. The method of any of the preceding examples 18-22, wherein the first loop portion, the second loop portion, and the third loop portion, are substantially co-planar.

24. The method of any of the preceding examples 18-22, wherein the first loop portion, the second loop portion, and the third loop portion, are located on different planes.

25. The method of any of the preceding examples 18-24, wherein the coil comprises a single winding of the conductive material having at least three non-overlapping loop portions.

26. The method of any of the preceding examples 18-25, wherein receiving wireless power from the transmitter comprises inductively receiving power via the magnetic field via a resonant circuit comprising the coil, the resonant circuit configured to resonate at an operating frequency of the magnetic field.

27. The method of any of the preceding examples 18-26, wherein providing the received power to the load comprises providing sufficient power to charge or power the load.

28. The method of any of the preceding examples 18-27, further comprising averaging the magnetic field such that a ratio of a maximum voltage received to a minimum voltage received by the coil satisfies a threshold.

29. The method of example 29, wherein the ratio comprises a value less than 1.5.

30. An apparatus for wirelessly receiving power. The apparatus includes means for wirelessly receiving power via a magnetic field, the means for wirelessly receiving power comprising at least three loop portions, including a first loop portion, a second loop portion, and a third loop portion, the second and third loop portions at least partially enclosed by the first loop portion, the second and third loop portions non-circumscribing and non-overlapping with each other. The apparatus further includes means for providing the received power to a load.

31. The apparatus of example 30, wherein at least one of the first loop portion, the second loop portion, or the third loop portion have a substantially rectangular dimension.

32. The apparatus of example 30, wherein a current in a portion of the second loop portion is in the opposite direction of a current in a portion of the third loop portion.

33. The apparatus of example 32, wherein the portion of the second loop portion having the current in the opposite direction of the current in the portion of the third loop portion comprises a portion positioned closest to the third loop portion.

34. The apparatus of any of examples 30, 32, or 33, wherein the second loop portion and the third loop portions have non-symmetrical dimensions.

35. The apparatus of any of the preceding examples 30-34, wherein the second loop portion and the third loop portions have substantially common dimensions and are placed adjacent to each other.

36. The apparatus of any of the preceding examples 30-35, wherein the second and third loop portions are substantially fully enclosed by the first loop portion.

37. The apparatus of any of the preceding examples 30-36, wherein the means for wirelessly receiving power further comprises more than two loop portions at least partially enclosed by the first loop portion.

38. The apparatus of any of the preceding examples 30-37, wherein the means for wirelessly receiving power comprises a single winding of the conductive material having at least three non-overlapping loop portions.

39. The apparatus of any of the preceding examples 30-37, wherein the means for wirelessly receiving power comprises two or more coils.

40. The apparatus of any of the preceding examples 30-39, wherein the first loop portion, the second loop portion, and the third loop portion, are substantially co-planar.

41. The apparatus of any of the preceding examples 30-39, wherein the first loop portion, the second loop portion, and the third loop portion, are located on different planes.

42. The apparatus of any of the preceding examples 30-39, wherein the first loop portion is located on a first plane, wherein the second loop portion and the third loop portion are located on a second plane different from the first plane.

43. The apparatus of any of the preceding examples 30-42, further comprising a resonant circuit comprising the means for wirelessly receiving power, the resonant circuit configured to resonate at an operating frequency of the magnetic field, the coil configured to inductively receive power via the magnetic field.

44. The apparatus of any of the preceding examples 30-43, further comprising a receive circuit coupled to the means for wirelessly receiving power and configured to power or charge a load based at least in part on the generated voltage.

45. The apparatus of any of the preceding examples 30-44, wherein the means for wirelessly receiving power is further configured to average the magnetic field such that a ratio of a maximum voltage received to a minimum voltage received by the coil satisfies a threshold.

46. The apparatus of example 45, wherein the ratio comprises a value less than 1.5.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, a means for selectively allowing current in response to a control voltage may comprise a first transistor. In addition, means for limiting an amount of the control voltage comprising means for selectively providing an open circuit may comprise a second transistor.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for wirelessly receiving power, the apparatus comprising:
    a coil circuit configured to generate a current in response to a magnetic field generated by a transmitter, the coil circuit comprising a conductive material having at least three loop portions, including a first loop portion, a second loop portion enclosing a first area, and a third loop portion enclosing a second area that is non-overlapping with the first area, the second and third loop portions fully enclosed by the first loop portion, the first loop portion, the second loop portion, and the third loop portion physically connected to create a single winding of the conductive material, the second loop portion and the third loop portion having a third area therebetween, the second loop portion having a first portion adjacent to a first portion of the first loop portion, and the third loop portion having a first portion adjacent to a second portion of the first loop portion and a second portion adjacent to a second portion of the second loop portion, wherein the generated current flows through the first portion of the first loop portion and the first portion of the second loop portion in a first direction and flows through the second portion of the first loop portion and the first portion of the third loop portion in a second direction, and wherein the generated current flows through the second portion of the second loop portion and the second portion of the third loop portion in opposite directions to create a field cancelling effect in the third area; and
    a receive circuit including a rectifier circuit, the receive circuit being electrically and conductively coupled to the first loop portion, wherein the receive circuit is configured to generate an output for at least one of powering or charging a load based at least in part on the generated current.

2. The apparatus of claim 1, wherein at least one of the first loop portion, the second loop portion, or the third loop portion have a substantially rectangular dimension.

3. The apparatus of claim 1, wherein the second portion of the second loop portion is positioned to allow the current to flow in the second direction and wherein the second portion of the third loop portion is positioned to allow the current to flow in the first direction that is opposite to the second direction.

4. The apparatus of claim 3, wherein the second portion of the second loop portion having the current in the opposite direction of the current in the second portion of the third loop portion comprises a portion positioned closest to the third loop portion.

5. The apparatus of claim 1, wherein the second loop portion and the third loop portion have non-symmetrical dimensions.

6. The apparatus of claim 1, wherein the second loop portion and the third loop portion have substantially common dimensions and are placed adjacent to each other.

7. The apparatus of claim 1, wherein the coil circuit further comprises more than two loop portions at least partially enclosed by the first loop portion.

8. The apparatus of claim 1, wherein the coil circuit comprises at least three non-overlapping loop portions.

9. The apparatus of claim 1, wherein the apparatus further comprises two or more coil circuits.

10. The apparatus of claim 1, wherein the first loop portion, the second loop portion, and the third loop portion are substantially co-planar.

11. The apparatus of claim 1, wherein the first loop portion, the second loop portion, and the third loop portion are located on different planes.

12. The apparatus of claim 1, wherein the first loop portion is located on a first plane, wherein the second loop portion and the third loop portion are located on a second plane different from the first plane.

13. The apparatus of claim 1, further comprising a resonant circuit comprising the coil circuit, the resonant circuit configured to resonate at an operating frequency of the magnetic field, the coil circuit configured to inductively receive power via the magnetic field.

14. The apparatus of claim 1, wherein the first, second, and third loop portions receive a maximum voltage and a minimum voltage by the coil circuit in response to the magnetic field, wherein a ratio of the maximum voltage to the minimum voltage is greater than a threshold.

15. The apparatus of claim 14, wherein the threshold is a value less than 1.5.

16. The apparatus of claim 1, wherein the second portion of the second loop portion is spaced apart from the second portion of the third loop portion to create the field cancelling effect in the third area.

17. An apparatus for wirelessly receiving power, the apparatus comprising:
    a first means for wirelessly receiving power via a magnetic field;
    a second means for wirelessly receiving power via the magnetic field;
    a third means for wirelessly receiving power via the magnetic field,
    the third means for wirelessly receiving power not overlapping the second means for wirelessly receiving power via the magnetic field, the second and third means for wirelessly receiving power fully enclosed by the first means for wirelessly receiving power, the first, second, and third means for wirelessly receiving power physically connected in series, and the second means and the third means having an area therebetween, the second means having a first portion adjacent to a first portion of the first means, and the third means having a first portion adjacent to a second portion of the first means and a second portion adjacent to a second portion of the second means, wherein the generated current flows through the first portion of the first means and the first portion of the second means in a first direction and flows through the second portion of the first means and the first portion of the third means in a second direction, and wherein a current flows through the second portion of the second means and the second portion of the third means in opposite directions to create a field cancelling effect in the area; and means for providing an output power to a load, the means for providing being electrically and conductively coupled to the first means for wirelessly receiving power and being configured to generate the output power for at least one of powering or charging the load based at least in part on the current.

18. A method of receiving wireless power, comprising:

receiving, at a coil circuit configured to generate a current, wireless power from a transmitter via a magnetic field, the coil circuit comprising a conductive material having at least three loop portions, including a first loop portion, a second loop portion enclosing a first area, and a third loop portion enclosing a second area that is non-overlapping with the first area, the second and third loop portions fully enclosed by the first loop portion, the first loop portion, the second loop portion, and the third loop portion physically connected to create a single winding of the conductive material, the second loop portion and the third loop portion having a third area therebetween, the second loop portion having a first portion adjacent to a first portion of the first loop portion, and the third loop portion having a first portion adjacent to a second portion of the first loop portion and a second portion adjacent to a second portion of the second loop portion, wherein the generated current flows through the first portion of the first loop portion and the first portion of the second loop portion in a first direction and flows through the second portion of the first loop portion and the first portion of the third loop portion in a second direction, and wherein the generated current flows through the second portion of the second loop portion and the second portion of the third loop portion in opposite directions to create a field cancelling effect in the third area; and providing an output power from a receiver circuit including a rectifier circuit to a load, the receiver circuit being electrically and conductively coupled to the first loop portion and being configured to generate the output power for at least one of powering or charging the load based at least in part on the generated current.

19. The method of claim 18, further comprising inducing a current in the coil circuit in response to the magnetic field, wherein the second portion of the second loop portion is positioned to allow the current to flow in the second direction and wherein the second portion of the third loop portion is positioned to allow the current to flow in the first direction that is opposite to the second direction.

20. The method of claim 19, wherein the second portion of the second loop portion having the current in the opposite direction of the current in the second portion of the third loop portion comprises a portion positioned closest to the third loop portion.

21. The method of claim 18, wherein the second loop portion and the third loop portion have substantially common dimensions and are placed adjacent to each other.

22. The method of claim 18, wherein the first loop portion, the second loop portion, and the third loop portion are substantially co-planar.

23. The method of claim 18, wherein the first loop portion, the second loop portion, and the third loop portion are located on different planes.

24. The method of claim 18, wherein the coil circuit comprises at least three non-overlapping loop portions.

25. The method of claim 18, wherein receiving wireless power from the transmitter comprises inductively receiving power via the magnetic field via a resonant circuit comprising the coil circuit, the resonant circuit configured to resonate at an operating frequency of the magnetic field.

26. The method of claim 18, wherein providing the output power to the load comprises providing sufficient power to at least one of charge or power the load.

27. The method of claim 18, further comprising averaging the magnetic field such that a ratio of a maximum voltage received to a minimum voltage received by the coil circuit is greater than a threshold.

28. The method of claim 27, wherein the ratio comprises a value less than 1.5.

29. The apparatus of claim 17, wherein the current flowing through the second portion of the second means and the second portion of the third means in opposite directions creates an averaging of the magnetic field generated by the transmitter and minimizes an applied voltage variance.

* * * * *